(12) United States Patent
Lee

(10) Patent No.: US 7,902,648 B2
(45) Date of Patent: Mar. 8, 2011

(54) INTERPOSER CONFIGURED TO REDUCE THE PROFILES OF SEMICONDUCTOR DEVICE ASSEMBLIES, PACKAGES INCLUDING THE SAME, AND METHODS

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 295 days.

(21) Appl. No.: 11/398,912

(22) Filed: Apr. 6, 2006

(65) Prior Publication Data

US 2006/0175690 A1    Aug. 10, 2006

Related U.S. Application Data

(63) Continuation of application No. 10/150,893, filed on May 17, 2002, now Pat. No. 7,145,225.

(30) Foreign Application Priority Data

Mar. 4, 2002    (SG) .............................. 200201263-1

(51) Int. Cl.
*H01L 23/495* (2006.01)

(52) U.S. Cl. .............................. 257/676; 257/E23.037; 257/E23.069; 257/E23.092; 257/E23.105; 257/E23.013; 257/E25.023; 257/778; 257/737; 257/774; 257/773; 257/784; 257/786; 257/684; 257/796

(58) Field of Classification Search .................. 257/676, 257/E23.037, E23.069, E23.092, E23.105, 257/E25.013, E23.023, 778, 737, 734, 738, 257/774, 773, 784, 786, 684, 796
See application file for complete search history.

(56) References Cited

U.S. PATENT DOCUMENTS

| | | | |
|---|---|---|---|
| 3,239,496 A | 3/1966 | Jursich | |
| 4,074,342 A | 2/1978 | Honn et al. | |
| 4,807,021 A | 2/1989 | Okumura | |
| 4,818,728 A | 4/1989 | Rai et al. | |
| 4,954,875 A | 9/1990 | Clements | |

FOREIGN PATENT DOCUMENTS

EP    0475022 A1    3/1992

(Continued)

OTHER PUBLICATIONS

Xiao et al., "Reliability Study and Failure Analysis of Fine Pitch Solder-Bumped Flip Chip on Low-Cost Flexible Substrate without Using Stiffener," IEEE, 2002. Proceedings, 52nd, Electronic Components and Technology Conference, pp. 112-118 (2002).

(Continued)

*Primary Examiner* — Alexander O Williams
(74) *Attorney, Agent, or Firm* — TraskBritt

(57) ABSTRACT

An interposer includes a substrate, a conductive structure configured to contact the back side of a semiconductor device and contact pads. The interposer may include first and second sets of contact pads carried by the substrate. The interposer may also include conductive traces carried by the substrate to electrically connect corresponding contact pads of the first and second sets. The receptacles, which may be formed in a surface of the substrate and expose contacts of the second set, may be configured to at least partially receive conductive structures that are secured to the contact pads of the second set. Thus, the interposer may be useful in providing semiconductor device assemblies and packages of reduced height or profile. Such assemblies and packages are also described, as are multi-chip modules including such assemblies or packages. In addition, methods for designing and fabricating the interposer are disclosed, as are methods for forming assemblies, packages, and multi-chip modules that include the interposer.

46 Claims, 6 Drawing Sheets

U.S. PATENT DOCUMENTS

| | | |
|---|---|---|
| 5,148,265 A | 9/1992 | Khandros |
| 5,258,648 A | 11/1993 | Lin |
| 5,346,861 A | 9/1994 | Khandros |
| 5,347,159 A | 9/1994 | Khandros et al. |
| 5,366,794 A | 11/1994 | Nakao |
| 5,385,869 A | 1/1995 | Liu et al. |
| 5,386,341 A | 1/1995 | Olson et al. |
| 5,394,303 A | 2/1995 | Yamaji |
| 5,397,921 A | 3/1995 | Karnezos |
| 5,404,044 A | 4/1995 | Booth et al. |
| 5,409,865 A | 4/1995 | Karnezos |
| 5,422,205 A | 6/1995 | Inoue et al. |
| 5,422,615 A * | 6/1995 | Shibagaki et al. ............ 333/246 |
| 5,438,477 A | 8/1995 | Pasch |
| 5,448,511 A | 9/1995 | Paurus et al. |
| 5,468,681 A | 11/1995 | Pasch |
| 5,468,995 A | 11/1995 | Higgins, III |
| 5,489,804 A | 2/1996 | Pasch |
| 5,504,277 A | 4/1996 | Danner |
| 5,598,033 A | 1/1997 | Behlen et al. |
| 5,608,265 A * | 3/1997 | Kitano et al. ................ 257/738 |
| 5,646,446 A | 7/1997 | Nicewarner, Jr. et al. |
| 5,663,530 A | 9/1997 | Schueller et al. |
| 5,668,405 A | 9/1997 | Yamashita |
| 5,674,785 A | 10/1997 | Akram et al. |
| 5,679,977 A | 10/1997 | Khandros |
| 5,683,942 A | 11/1997 | Kata |
| 5,697,148 A | 12/1997 | Lance, Jr. et al. |
| 5,699,027 A * | 12/1997 | Tsuji et al. .................. 333/193 |
| 5,710,071 A | 1/1998 | Beddingfield et al. |
| 5,719,449 A | 2/1998 | Strauss |
| 5,721,151 A | 2/1998 | Padmanabhan et al. |
| 5,723,347 A | 3/1998 | Hirano et al. |
| 5,739,585 A | 4/1998 | Akram et al. |
| 5,742,100 A | 4/1998 | Schroeder et al. |
| 5,747,982 A | 5/1998 | Dromgoole et al. |
| 5,752,182 A | 5/1998 | Nakatsuka et al. |
| 5,758,413 A | 6/1998 | Chong et al. |
| 5,768,109 A | 6/1998 | Gulick et al. |
| 5,776,797 A | 7/1998 | Nicewarner, Jr. et al. |
| 5,777,391 A | 7/1998 | Nakamura |
| 5,796,591 A | 8/1998 | Dalal et al. |
| 5,798,285 A | 8/1998 | Bentlage et al. |
| 5,798,567 A | 8/1998 | Kelly et al. |
| 5,805,422 A | 9/1998 | Otake et al. |
| 5,812,378 A | 9/1998 | Fjelstad et al. |
| 5,818,113 A | 10/1998 | Iseki et al. |
| 5,821,624 A | 10/1998 | Pasch |
| 5,834,338 A | 11/1998 | Takeda et al. |
| 5,834,366 A | 11/1998 | Akram |
| 5,834,848 A | 11/1998 | Iwasaki |
| 5,835,355 A | 11/1998 | Dordi |
| 5,843,808 A | 12/1998 | Karnezos |
| 5,844,168 A | 12/1998 | Schueller et al. |
| 5,844,315 A | 12/1998 | Melton et al. |
| 5,866,953 A | 2/1999 | Akram et al. |
| 5,877,559 A | 3/1999 | Takayama et al. |
| 5,886,408 A | 3/1999 | Ohki et al. |
| 5,891,753 A | 4/1999 | Akram |
| 5,892,271 A | 4/1999 | Takeda et al. |
| 5,898,224 A | 4/1999 | Akram |
| 5,905,303 A | 5/1999 | Kata |
| 5,973,389 A | 10/1999 | Culnane et al. |
| 5,973,404 A | 10/1999 | Akram et al. |
| 5,977,640 A | 11/1999 | Bertin et al. |
| 5,982,030 A | 11/1999 | MacIntrye |
| 5,984,691 A | 11/1999 | Brodsky et al. |
| 5,986,460 A | 11/1999 | Kawakami |
| 5,990,545 A | 11/1999 | Schueller et al. |
| 5,991,161 A | 11/1999 | Samaras et al. |
| 6,005,776 A | 12/1999 | Holman et al. |
| 6,008,543 A | 12/1999 | Iwabuchi |
| 6,011,694 A | 1/2000 | Hirakawa |
| 6,013,948 A | 1/2000 | Akram et al. |
| 6,020,629 A | 2/2000 | Farnworth et al. |
| 6,022,761 A | 2/2000 | Grupen-Shemansky et al. |
| 6,024,584 A | 2/2000 | Lemke et al. |
| 6,027,346 A | 2/2000 | Sinsheimer et al. |
| 6,028,365 A | 2/2000 | Akram et al. |
| 6,034,427 A | 3/2000 | Lan et al. |
| 6,037,665 A | 3/2000 | Miyazaki |
| 6,039,889 A | 3/2000 | Zhang et al. |
| 6,040,630 A | 3/2000 | Panchou et al. |
| 6,048,755 A | 4/2000 | Jiang et al. |
| 6,050,832 A | 4/2000 | Lee et al. |
| 6,057,178 A | 5/2000 | Galuschki et al. |
| 6,060,782 A | 5/2000 | Ohsono et al. |
| 6,064,114 A | 5/2000 | Higgins, III |
| 6,072,233 A | 6/2000 | Corisis et al. |
| 6,074,897 A | 6/2000 | Degani et al. |
| 6,075,710 A | 6/2000 | Lau |
| 6,079,991 A | 6/2000 | Lemke et al. |
| 6,093,035 A | 7/2000 | Lemke et al. |
| 6,116,921 A | 9/2000 | Scholz et al. |
| 6,124,631 A | 9/2000 | Cardot et al. |
| 6,127,736 A | 10/2000 | Akram |
| 6,133,072 A | 10/2000 | Fjelstad |
| 6,133,637 A | 10/2000 | Hikita et al. |
| 6,137,062 A | 10/2000 | Zimmerman |
| 6,137,164 A | 10/2000 | Yew et al. |
| 6,137,183 A | 10/2000 | Sako |
| 6,157,541 A | 12/2000 | Hacke |
| 6,165,885 A | 12/2000 | Gaynes et al. |
| 6,172,422 B1 | 1/2001 | Chigawa et al. |
| 6,177,723 B1 | 1/2001 | Eng et al. |
| 6,179,598 B1 | 1/2001 | Brand |
| 6,180,881 B1 | 1/2001 | Isaak |
| 6,191,487 B1 | 2/2001 | Rodenbeck et al. |
| 6,198,634 B1 | 3/2001 | Armezzani et al. |
| 6,208,521 B1 | 3/2001 | Nakatsuka |
| 6,208,525 B1 | 3/2001 | Imasu et al. |
| 6,212,768 B1 | 4/2001 | Murakami |
| 6,214,156 B1 | 4/2001 | Takano et al. |
| 6,217,343 B1 | 4/2001 | Okuno |
| 6,218,202 B1 | 4/2001 | Yew et al. |
| 6,219,911 B1 | 4/2001 | Estes et al. |
| 6,221,763 B1 | 4/2001 | Gilton et al. |
| 6,222,265 B1 | 4/2001 | Akram et al. |
| 6,225,688 B1 | 5/2001 | Kim et al. |
| 6,229,711 B1 | 5/2001 | Yoneda |
| 6,232,666 B1 | 5/2001 | Corisis et al. |
| 6,239,496 B1 | 5/2001 | Asada |
| 6,242,932 B1 | 6/2001 | Hembree |
| 6,262,895 B1 | 7/2001 | Forthun |
| 6,265,775 B1 | 7/2001 | Seyyedy |
| 6,268,654 B1 * | 7/2001 | Glenn et al. ................ 257/704 |
| 6,271,469 B1 | 8/2001 | Ma et al. |
| 6,282,046 B1 | 8/2001 | Lam |
| 6,282,094 B1 * | 8/2001 | Lo et al. ..................... 361/704 |
| 6,285,081 B1 | 9/2001 | Jackson |
| 6,291,265 B1 | 9/2001 | Mess |
| 6,291,775 B1 | 9/2001 | Saitoh |
| 6,291,884 B1 | 9/2001 | Glenn et al. |
| 6,294,455 B1 | 9/2001 | Ahn |
| 6,295,730 B1 | 10/2001 | Akram |
| 6,300,679 B1 | 10/2001 | Mukerji et al. |
| 6,310,288 B1 | 10/2001 | Moden |
| 6,323,060 B1 | 11/2001 | Isaak |
| 6,338,985 B1 | 1/2002 | Greenwood |
| 6,376,769 B1 | 4/2002 | Chung |
| 6,404,648 B1 | 6/2002 | Slupe et al. |
| 6,407,450 B1 | 6/2002 | Verma et al. |
| 6,413,102 B2 | 7/2002 | Jiang et al. |
| 6,429,516 B1 | 8/2002 | Tsunoi |

| | | | |
|---|---|---|---|
| 6,432,737 B1 | 8/2002 | Webster | |
| 6,449,840 B1 | 9/2002 | Le et al. | |
| 6,452,807 B1 | 9/2002 | Barrett | |
| 6,468,831 B2 | 10/2002 | Leong et al. | |
| 6,482,676 B2 | 11/2002 | Tsunoi et al. | |
| 6,486,544 B1 | 11/2002 | Hashimoto | |
| 6,489,676 B2 * | 12/2002 | Taniguchi et al. | 257/698 |
| 6,489,687 B1 | 12/2002 | Hashimoto | |
| 6,492,737 B1 | 12/2002 | Imasu et al. | |
| 6,504,241 B1 | 1/2003 | Yanagida | |
| 6,507,118 B1 | 1/2003 | Schueller | |
| 6,515,324 B2 | 2/2003 | Shibuya et al. | |
| 6,518,677 B1 | 2/2003 | Capote et al. | |
| 6,534,853 B2 | 3/2003 | Liu et al. | |
| 6,552,910 B1 | 4/2003 | Moon et al. | |
| 6,558,978 B1 | 5/2003 | McCormick | |
| 6,563,223 B2 | 5/2003 | Freeman | |
| 6,586,830 B2 | 7/2003 | Saito | |
| 6,600,222 B1 | 7/2003 | Levardo | |
| 6,610,559 B2 | 8/2003 | Wang et al. | |
| 6,700,208 B1 | 3/2004 | Yoneda | |
| 6,714,418 B2 | 3/2004 | Frankowsky et al. | |
| 6,730,855 B2 | 5/2004 | Bando | |
| 6,744,122 B1 | 6/2004 | Hashimoto | |
| 6,756,251 B2 | 6/2004 | Lee | |
| 6,780,746 B2 | 8/2004 | Kinsman et al. | |
| 6,787,918 B1 | 9/2004 | Tsai et al. | |
| 6,791,195 B2 * | 9/2004 | Urushima | 257/783 |
| 6,800,930 B2 | 10/2004 | Jackson et al. | |
| 6,847,105 B2 | 1/2005 | Koopmans | |
| 6,867,496 B1 | 3/2005 | Hashimoto | |
| 7,145,225 B2 * | 12/2006 | Lee | 257/686 |
| 7,298,043 B2 * | 11/2007 | Yui | 257/713 |
| 7,347,702 B2 | 3/2008 | Eldridge et al. | |
| 2001/0024129 A1 | 9/2001 | Akram et al. | |
| 2001/0048157 A1 | 12/2001 | Murtuza | |
| 2001/0053563 A1 | 12/2001 | Kim et al. | |
| 2002/0045611 A1 | 4/2002 | Abrams et al. | |
| 2002/0079594 A1 | 6/2002 | Sakurai | |
| 2002/0127769 A1 | 9/2002 | Ma et al. | |
| 2002/0142513 A1 | 10/2002 | Fee et al. | |
| 2002/0167092 A1 | 11/2002 | Fee et al. | |
| 2002/0185661 A1 | 12/2002 | Kawanobe et al. | |
| 2003/0012930 A1 | 1/2003 | Brousseau, III | |
| 2003/0042595 A1 | 3/2003 | Canella | |
| 2003/0134450 A1 | 7/2003 | Lee | |
| 2003/0164543 A1 * | 9/2003 | Kheng Lee | 257/706 |
| 2003/0178719 A1 * | 9/2003 | Combs et al. | 257/704 |
| 2003/0209813 A1 * | 11/2003 | Azuma | 257/797 |
| 2004/0026773 A1 | 2/2004 | Koon et al. | |
| 2004/0130020 A1 * | 7/2004 | Kuwabara et al. | 257/723 |
| 2004/0197955 A1 * | 10/2004 | Lee | 438/108 |
| 2004/0212055 A1 | 10/2004 | Exposito et al. | |
| 2004/0217454 A1 | 11/2004 | Brechignac et al. | |
| 2005/0073039 A1 * | 4/2005 | Kasuya et al. | 257/690 |
| 2005/0122265 A1 * | 6/2005 | Gaucher et al. | 343/700 MS |
| 2005/0133906 A1 * | 6/2005 | Woodall et al. | 257/707 |
| 2006/0065972 A1 * | 3/2006 | Khan et al. | 257/712 |
| 2006/0091523 A1 * | 5/2006 | Shimanuki | 257/698 |
| 2006/0289989 A1 * | 12/2006 | Yee et al. | 257/720 |
| 2008/0083981 A1 * | 4/2008 | Romig et al. | 257/707 |
| 2008/0178463 A1 * | 7/2008 | Okubora | 29/830 |
| 2009/0115050 A1 * | 5/2009 | Kasuya et al. | 257/701 |

FOREIGN PATENT DOCUMENTS

| | | |
|---|---|---|
| EP | 684644 | 11/1995 |
| EP | 0997942 A2 | 5/2000 |
| EP | 1009027 | 6/2000 |
| JP | 04030456 | 2/1992 |
| JP | 9-82857 * | 3/1997 |
| JP | 2002-028702/04 | 9/1999 |
| JP | 2000-183082 | 6/2000 |
| JP | 02000230964 | 8/2000 |
| JP | 2001077294 | 3/2001 |
| KR | 2001054744 | 7/2001 |
| KR | 20010058357 | 7/2001 |
| WO | WO 99/65282 | 12/1999 |
| WO | WO 01/33623 | 5/2001 |

OTHER PUBLICATIONS

Xiao et al., "Reliability Study and Failure Analysis of Fine Pitch Solder Bumped Flip Chip on Low-Cost Printed Circuit Board Substrate," IEEE, 2001, Proceedings, 51$^{st}$, Electronic Components and Technology Conference, 8 pages (2001).

Australian Patent Office Search Report, May 30, 2003; 4 pages.

Australian Search Report dated Aug. 11, 2004 (3 pages).

Australian Search Report dated Aug. 16, 2004 (4 pages).

Al-Sarawi et al., "A review of 3-D packaging technology," *Components. Packaging, and Manufacturing Technology, Part B: IEEE Transactions on Advanced Packaging*. vol. 21, Issue 1, Feb. 1998, pp. 2-14.

Andros et al., "TBGA Package Technology," *Components, Packaging, and Manufacturing Technology, Part B: IEEE Transactions on Advanced Packaging*, vol. 17, Issue 4, Nov. 1994, pp. 564-568.

Clot et al., "Flip-Chip on Flex for 3D Packaging," 1999. *24$^{th}$IEEE/CPMT*, Oct. 18-19, 1999, pp. 36-41.

Ferrando et al., "Industrial approach of a flip-chip method using the stud-bumps with a non-conductive paste," *Adhesive Joining and Coating Technology in Electronics Manufacturing*, 2000. Proceedings. 4$^{th}$ International Conference on, Jun. 18-21, 2000, pp. 205-211.

Gallagher et al., "A Fully Additive, Polymeric Process for the Fabrication and Assembly of Substrate and Component Level Packaging," *The First IEEE International Symposium on Polymeric Electronics Packaging*. Oct. 26-30, 1997, pp. 56-63.

Geissinger et al., "Tape Based CSP Package Supports Fine Pitch Wirebonding," *Electronics Manufacturing Technology Symposium*, 2002, IEMT 2002, 27$^{th}$ Annual IEEE/SEMI International, Jul. 17-18, 2002, pp. 41-452.

Hatanaka, H., "Packaging processes using flip chip bonder and future directions of technology development," *Electronics Packaging Technology Conference*, 2002. 4$^{th}$, Dec. 10-12, 2002, pp. 434-439.

Haug et al., "Low-Cost Direct Chip Attach: Comparison of SMD Compatible FC Soldering with Anisotropically Conductive Adhesive FC Bonding." *IEEE Transactions on Electronics Packaging Manufacturing*, vol. 23, No. 1, Jan. 2000, pp. 12-18.

Isaak, H. et al., "Development of Flex Stackable Carriers" IEEE Electronic Components and Technology Conference. 2000 Proceedings 50th, May 21, 2000-May 24, 2000. Las Vegas, NV. USA. pp. 378-384, IEEE Catalog No: 00CH37070.

Kloeser et al., "Fine Pitch Stencil Printing of Sn/Pb and Lead Free Solders for Flip Chip Technology," *IEEE Transactions of CPMT—Part C*. vol. 21, No. 1, 1998, pp. 41-49.

Lee et al., "Enhancement of Moisture Sensitivity Performance of a FBGA," *Proceedings of International Symposium on Electronic Materials & Packaging*, 2000. pp. 470-475.

Li et al., "Stencil Printing Process Development for Flip Chip Interconnect," *IEEE Transactions Part C: Electronics Packaging Manufacturing*, vol. 23 Issue 3. (Jul. 2000). pp. 165-170.

Lyons et al., "A New Approach to Using Anisotropically Conductive Adhesives for Flip-Chip Assembly. Part A," *IEEE Transactions on Components, Packaging, and Manufacturing Technology*, vol. 19, Issue 1, Mar. 1996. pp. 5-11.

Teo et al., "Enhancing Moisture Resistance of PBGA," *Electronic Components and Technology Conference*, 1988. 48$^{th}$ IEEE, May 25-28, 1998, pp. 930-935.

Teutsch et al, "Wafer Level CSP using Low Cost Electroless Redistribution Layer," *Electronic Components and Technology Conference*, 2000. 2000 Proceedings. 50$^{th}$, May 21-24, 2000, pp. 107-113.

"The 2003 International Technology Roadmap for Semiconductor: Assembly and Packaging."

Tsui et al.. "Pad redistribution technology for flip chip applications," *Electronic Components and Technology Conference*, 1998. 48$^{th}$ IEEE, May 25-28, 1998, pp. 1098-1102.

Xiao et al., "Reliability study and failure analysis of fine pitch solder-bumped flip chip on low-cost flexible substrate without using stiffener," IEEE, 2002. Proceedings 52$^{nd}$, May 28-31, 2002, pp. 112-118.

* cited by examiner

INTERPOSER CONFIGURED TO REDUCE THE PROFILES OF SEMICONDUCTOR DEVICE ASSEMBLIES, PACKAGES INCLUDING THE SAME, AND METHODS

CROSS-REFERENCE TO RELATED APPLICATIONS

This application is a continuation of application Ser. No. 10/150,893, filed May 17, 2002, now U.S. Pat. No. 7,145,225 B2, issued Dec. 5, 2006, which is related to U.S. patent application Ser. No. 09/944,465, filed Aug. 30, 2001, and titled MICROELECTRONIC DEVICES AND METHODS OF MANUFACTURE; now U.S. Pat. No. 6,756,251, issued Jun. 29, 2004, and to the following U.S. Patent Applications filed on even date herewith: Ser. No. 10/150,892, filed May 17, 2002, and titled METHOD AND APPARATUS FOR FLIP-CHIP PACKAGING PROVIDING TESTING CAPABILITY, pending; Ser. No. 10/150,516, filed May 17, 2002, and titled SEMICONDUCTOR DIE PACKAGES WITH RECESSED INTERCONNECTING STRUCTURES AND METHODS FOR ASSEMBLING THE SAME, now U.S. Pat. No. 7,112,520, issued Sep. 26, 2006; Ser. No. 10/150, 653, filed May 17, 2002, and entitled FLIP CHIP PACKAGING USING RECESSED INTERPOSER TERMINALS, now U.S. Pat. No. 7,161,237, issued Jan. 9, 2007; Ser. No. 10/150,902, filed May 17, 2002, and entitled METHOD AND APPARATUS FOR DIELECTRIC FILLING OF FLIP CHIP ON INTERPOSER ASSEMBLY, now U.S. Pat. No 6,975, 035, issued Dec. 13, 2005; and Ser. No. 10/150,901, filed May 17, 2002, and entitled METHODS FOR ASSEMBLY AND PACKAGING OF FLIP CHIP CONFIGURED DICE WITH INTERPOSER, now U.S. Pat. No. 7,348,215, issued Mar. 25, 2008.

BACKGROUND OF THE INVENTION

1. Field of the Invention

The present invention relates to interposers for packaging semiconductor devices with array-type connection patterns. In particular, the present invention relates to tape-type interposers that are useful in semiconductor device assemblies and packages of reduced package height, or profile, and to semiconductor device assemblies and packages of reduced profile. The present invention also relates to methods for fabricating the tape-type interposers and to methods for forming semiconductor device assemblies and packages that include the tape-type interposers.

2. State of the Art

Conventionally, semiconductor dice have been packaged in plastic or, less commonly, in ceramic packages. Packages may support, protect, and dissipate heat from semiconductor dice. Packages may also provide external connective elements for providing power and signal distribution to and from semiconductor dice, as well as for facilitating electrical testing, such as burn-in testing and circuit evaluation, of semiconductor dice prior to or after assembly thereof with higher-level components, such as carrier substrates or circuit boards.

The ever-decreasing sizes of electronic devices, such as cellular telephones, handheld computers, and portable computers, have driven the need for semiconductor device assemblies and packages with ever-decreasing profiles, as well as the need for semiconductor device assemblies and packages that consume ever-decreasing amounts of the surface areas, or "real estate", of carrier substrates, such as circuit boards.

The need for semiconductor device assemblies and packages that consume ever-decreasing amounts of real estate has been met by use of external connection technologies, such as so-called "flip-chip" connections, in which a semiconductor device is positioned over a carrier therefore in an inverted orientation with contact pads (e.g., bond pads of a bare semiconductor die or contacts of a semiconductor device assembly or package) of the semiconductor device and corresponding terminal pads of the carrier in alignment with one another. Flip-chip type connections provide the desired number of connections to a semiconductor device without requiring that an assembly or package that includes the semiconductor device have peripheral edges that extend a substantial distance beyond the peripheral edges of the semiconductor device. This type of semiconductor device assembly or package is typically referred to as a "grid array" package (e.g., a ball grid array (BGA) package or pin grid array (PGA) package) due to the arrangement of input and output contacts thereof in a grid array connection pattern. Such contact pad arrangements facilitate the use of a greater number of connections than would otherwise be possible when contact pads are arranged only along the periphery of an interposer.

Grid array semiconductor device assemblies and packages typically include an interposer to which one or more semiconductor dice may be secured and electrically connected. A substrate of the interposer may be formed from a variety of different, typically electrically insulative or insulator-coated materials, including flexible materials, such as polymer (e.g., polyimide) films or tapes, and rigid materials, such as silicon, glass, ceramic, or organic materials (e.g., FR-4 resin).

Interposers for use in grid array assemblies and packages also typically include conductive traces that extend between first and second sets of contacts, with each of the foregoing being carried by the interposer substrate. Contacts of a first set are electrically connectable to corresponding bond pads of a semiconductor die. Contacts of a second set are configured for making external electrical connections to other electronic components, such as circuit boards or other semiconductor devices. When the first and second sets of contacts are on opposite sides of the interposer, conductive vias may be positioned along one or more conductive traces to facilitate communication between contact pads of the first set and their corresponding contact pads of the second set. The first and second sets of contact pads are arranged in such a way as to redistribute the locations of the bond pads of a semiconductor device secured to the interposer. Such redistribution may provide for a contact pad arrangement that is more desirable than the arrangement of bond pads on the semiconductor device, for a contact pad that is more useful than the bond pad arrangement in flip-chip applications, for increased spacing or pitch between adjacent contact pads relative to that between corresponding, adjacent bond pads of the semiconductor device, or some combination of these features.

When such an interposer is assembled with a semiconductor device, the contact pads of the first group are typically connected to corresponding bond pads of the semiconductor device by way of discrete conductive elements, such as bond wires, conductive tape-automated bond (TAB) elements carried upon a flexible, dielectric substrate, or by so-called "flip-chip" bonding techniques, which employ conductive structures such as balls, bumps, columns, or other structures formed from conductive material, such as metal, metal alloy (e.g., solder), conductive or conductor-filled polymer, anisotropically (i.e., z-axis) conductive elastomer, or the like.

An interposer-semiconductor device assembly may communicate with electronic components external thereto by way of external conductive elements, such as conductive balls, bumps, columns, pins, or other structures, that extend from contact pads of the second set. When solder balls are employed, the connection pattern of such a semiconductor device assembly is termed a "ball grid array" (BGA) connection pattern or a "fine ball grid array" (FBGA) connection pattern, depending upon the spacing or pitch between adjacent solder balls. Similarly, when pins are used as the external conductive elements of such an assembly, the connection pattern of the assembly may be referred to as a "pin grid array" (PGA) connection pattern.

Conventionally, the thicknesses of such assemblies are defined by the cumulative thicknesses of the interposer, the adhesive material securing a semiconductor device thereto, the semiconductor device, the distance bond wires protrude above an active surface of the semiconductor device, and the distance external conductive elements extend from the interposer.

Several interposer designs have been developed to address the need for semiconductor device assemblies and packages of ever-decreasing profiles. For example, some rigid interposers include recesses for receiving all or part of a semiconductor device. The recesses of such interposers may also be configured to receive all or part of the discrete conductive elements (e.g., bond wires) that electrically connect bond pads of a semiconductor device to corresponding contact pads of the interposer. The profiles of grid array-type assemblies or packages including such interposers are typically defined by a combination of the thickness of the interposer, the distance that discrete conductive elements protrude above a surface of the interposer, and the height of conductive structures protruding from an opposite surface of the interposer. While these grid array packages are thinner than their predecessors by an amount equal to the full or partial thicknesses of the semiconductor devices and adhesive layers thereof, it is difficult, if not impossible, to further decrease their profiles.

Accordingly, there are needs for semiconductor device assemblies and packages having reduced profiles, as well as for an interposer configured to impart an assembly or package including the same with a thinner profile.

BRIEF SUMMARY OF THE INVENTION

The present invention includes an interposer that may be used in semiconductor device assemblies and packages to impart such assemblies or packages with relatively thin profiles. In addition, the present invention includes flip-chip type semiconductor device assemblies and packages that include such interposers. The present invention also includes methods for fabricating the inventive interposers.

An interposer incorporating teachings of the present invention includes a thin substrate with at least one attach region. Each attach region of the interposer is configured to receive one or more semiconductor devices (e.g., one or more semiconductor dice). A first set of contact pads is positioned at or proximate to the attach region so that discrete conductive elements (e.g., bond wires, conductive tape-automated bonding (TAB) elements carried upon a dielectric film, leads, or conductive structures such as balls, bumps, columns, pins, etc., formed from conductive material) may appropriately connect bond pads of the one or more semiconductor devices to corresponding contact pads of the first set. Each contact pad of the first set, or first contact pad, may be electrically connected to a corresponding contact pad of a second set, or second contact pad, by way of a conductive trace that extends therebetween.

In addition, an interposer according to the present invention may include a ground plane, a thermally conductive structure, which may form all or part of a thermal transfer element, or a combination thereof. If any of these structures are present, they may be formed on the same surface of the interposer as that on which a die attach region is located and extend proximate to or at least partially into the die attach region. If these structures extend into the die attach region, they may comprise a part of the die attach region so as to be in contact with a semiconductor device upon placement thereof in that die attach region.

The interposer may also include "dummy" contact pads that do not communicate with a bond pad of the semiconductor device. Instead, the dummy contact pads may communicate with or comprise a part of a ground plane and/or a thermally conductive structure of the interposer. Dummy contact pads that communicate with or that are part of a thermally conductive structure of the interposer may be positioned so as to facilitate the transfer of heat away (i.e., the dissipation of heat) from a semiconductor device secured to the interposer or from an assembly or package that includes the interposer.

Each of the contact pads and conductive traces of the interposer may be carried upon the same, first surface thereof and in a single layer. Alternatively, the first and second sets of contact pads may be carried on opposite surfaces of the interposer substrate, with at least portions of the conductive traces, or electrically conductive vias positioned along the lengths thereof, being carried internally within the interposer substrate.

An interposer that incorporates teachings of the present invention also includes recesses that are configured to partially receive conductive structures, such as balls, bumps, columns, or pins. The recesses may be formed in a second surface of the interposer substrate, which is opposite from the first surface thereof or, if a semiconductor device is to be secured to the interposer in a flip-chip orientation, in the first surface of the interposer substrate. Each recess exposes and, thus, communicates with at least a portion of a surface of a corresponding second contact pad, dummy contact pad, or a portion of a ground plane and/or thermally conductive structure. The recesses may be arranged in a grid array or otherwise, as desired or required, to effect electrical connection to higher-level packaging.

A method for forming the interposer includes forming the first, second, and dummy contact pads, as well as the conductive traces, from one or more layers of conductive material on the interposer substrate. If one or both of a ground plane and a thermally conductive structure are desired, these structures may also be formed from the layer or layers of conductive material. By way of example only, each layer of conductive material may be laminated onto at least a portion of a surface of the interposer substrate or deposited thereon (e.g., by physical vapor deposition (PVD), such as sputtering, or by chemical vapor deposition (CVD)). Also by way of example and not to limit the scope of the present invention, the conductive features may be formed by known patterning processes. The recesses may be formed in the second surface of the interposer substrate at locations that correspond to the positions of each of the second contact pads and the dummy contact pads to which electrical connection is desired. Any suitable process may be used to form the recesses, including, without limitation, mask and etch processes that are appropriate for the material of the interposer substrate, laser ablation, die cutting or punching, drilling, milling, or other means known in the art. Formation of the recesses may be effected either before or after formation of the conductive features.

An assembly according to the present invention includes the interposer with at least one semiconductor device secured to a corresponding die attach region thereof. Each semiconductor device of such an assembly or package may be attached to a corresponding die attach region of the interposer as known in the art, such as by use of an adhesive material, an adhesive-coated element (e.g., adhesive-coated tape), or otherwise. If the die attach region of the interposer includes a thermally conductive structure, a thermally conductive adhesive material may be used to secure the semiconductor device to the interposer and in thermal communication with the thermally conductive structure thereof. Bond pads of each semiconductor device may be electrically connected to corresponding first contact pads. Second contact pads that correspond to each first contact pad in communication with a bond pad of a semiconductor device have conductive structures, such as balls, bumps, columns, or pins formed from conductive material, secured thereto. Each of the conductive structures is partially contained within the recess that corresponds to the second contact pad to which that conductive structure is secured. In addition, if dummy contact pads are present on the interposer, one or more of the dummy contact pads may have conductive structures secured thereto. Conductive structures that correspond to dummy contact pads of the interposer may also be partially contained within corresponding recesses.

The use of a relatively thin interposer substrate that at least partially encompasses the conductive structures may reduce the overall height, or profile, of a semiconductor device assembly or package relative to an equivalent assembly or package with conductive structures that are not recessed relative to the interposer thereof.

Further, if the interposer of such a semiconductor device assembly or package includes a thermal transfer element or other thermally conductive structure in contact with the semiconductor device of the assembly or package, conductive structures that communicate with dummy contact pads or with the thermally conductive structure itself may provide enhanced thermal dissipation from the semiconductor device during operation thereof. In such an embodiment, the semiconductor device is oriented on the interposer in such a way that the thermal transfer element or other thermally conductive structure of the interposer and the semiconductor device are in contact with one another.

Assemblies according to the present invention that include more than one semiconductor device are referred to as multi-chip modules (MCMs). An MCM may be formed by stacking multiple assemblies of the present invention with adjacent assemblies electrically connected to one another by way of electrical connections between conductive structures protruding from an upper semiconductor device assembly and corresponding contact pads of a third set, or third contact pads, on an interposer of an underlying semiconductor device assembly. Each of the contact pads of the underlying assembly may communicate with either a first contact pad and, thus, a corresponding bond pad of a semiconductor device of that assembly or a second contact pad of the underlying assembly which, in turn, communicates with a conductive structure secured thereto.

Alternatively, the semiconductor devices of an MCM that incorporates teachings of the present invention may be stacked relative to one another or positioned at different locations on a single interposer and electrically connected to that interposer by discrete conductive elements positioned between bond pads of the semiconductor devices and corresponding first contact pads of the interposer.

A semiconductor device package according to the present invention includes an assembly with a suitable encapsulant or packaging material at least partially protecting one or both of a semiconductor device of the assembly and discrete conductive elements that electrically connect bond pads of the semiconductor device assembly and corresponding first contact pads of the interposer.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments for carrying out the invention.

DETAILED DESCRIPTION OF THE INVENTION

The present invention includes an interposer for use in semiconductor device assemblies and packages, assemblies and packages including the interposer, and multi-chip modules. The present invention also includes methods for designing and forming the interposer, as well as for forming semiconductor device assemblies and packages that include the interposer.

Figure 1A:
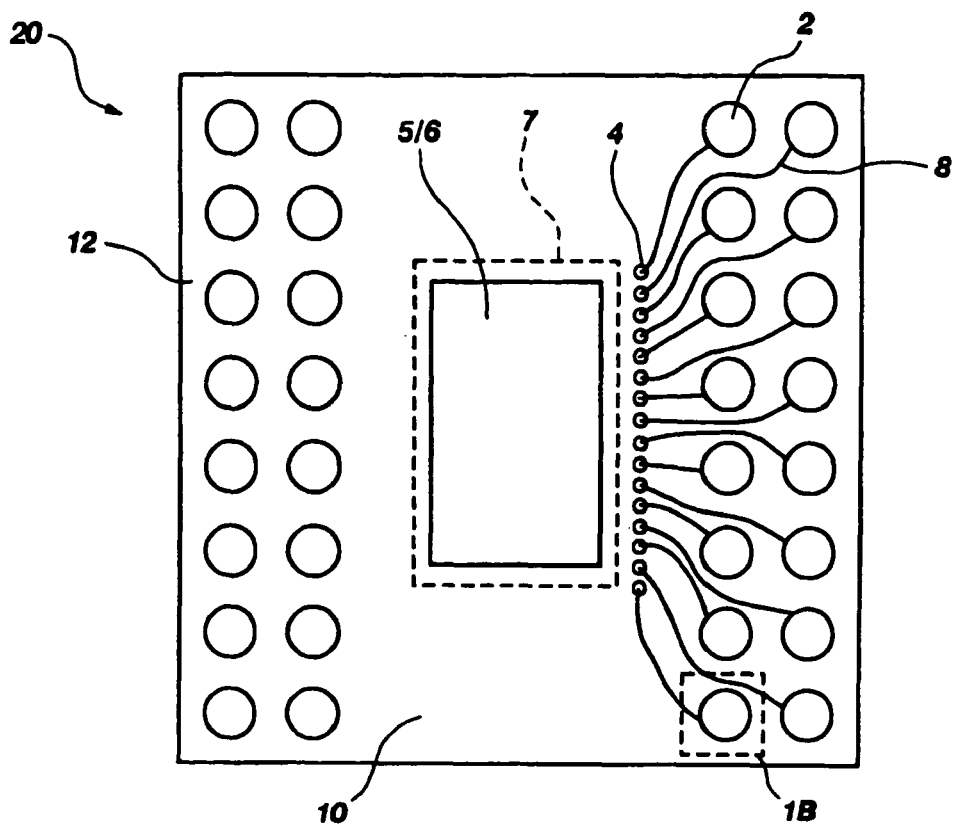
FIG. 1A is top view of an interposer incorporating teachings of the present invention.
Figure 1B:
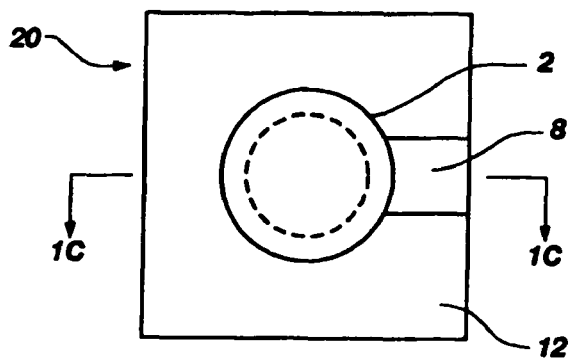
FIG. 1B is a top view of an interposer area depicted in FIG. 1A.
Figure 1C:
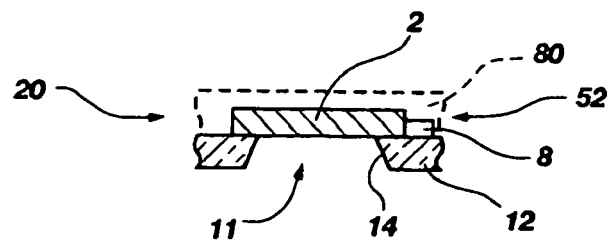
FIG. 1C is a cross-sectional representation of the interposer area depicted in FIG. 1B.

Referring to FIGS. 1A-1C, an interposer 20 of the present invention is illustrated. The interposer 20 includes a substrate 12, which is also referred to herein as an "interposer substrate," and at least one layer 52 of conductive structures. As depicted, the at least one layer 52 of conductive structures includes first contact pads 4 located proximate an attach location or region 7 on the substrate 12 and conductive traces 8 extending somewhat laterally from corresponding first contact pads 4 to corresponding second contact pads 2. As shown in FIG. 1C, apertures 14 that are formed at least partially through the substrate 12 expose second contact pads 2 therethrough.

The substrate 12 may be formed from either a rigid or flexible material and may comprise a substantially planar member. Silicon or another semiconductor material (e.g., gallium arsenide, indium phosphide, etc.) may be used to form the substrate 12 with at least some surfaces thereof, including those that will contact or be located proximate to the conductive structures of the interposer 20 or another semiconductor device component to be assembled therewith, being covered with an electrically insulative material (e.g., a silicon oxide or silicon nitride) to prevent electrical shorting of the conductive structures of the interposer 20. Other suitable materials for forming the interposer substrate 12 include, without limitation, FR-4 resin, glass, ceramics, and polyimide.

The second contact pads 2 of the interposer 20 are arranged to provide a desired pattern, or "footprint", of electrical connections to facilitate communication between at least one semiconductor device to be secured to the interposer 20 and external electronic devices through a larger-scale substrate, such as a circuit board or other carrier.

FIGS. 1B and 1C depict a second contact pad 2 of an interposer 20 incorporating teachings of the present invention. Conductive material, such as copper, aluminum, gold, or other conductive material, that is carried by the substrate 12 forms the second contact pads 2, as well as the conductive traces 8 and the first contact pads 4. When the second contact pads 2 are part of a layer 52 of conductive structures that is carried upon a surface of the substrate 12, areas of the substrate 12 that are superimposed by the second contact pads 2 are substantially removed to form receptacles 11, which facilitate the formation of electrical connections between the second contact pads 2 of the interposer 20 and other components, such as a circuit board or other carrier. The receptacles 11 are configured to at least partially receive conductive structures, such as balls, bumps, columns, pins, or other elements formed from conductive material such as a metal or metal alloy (e.g., solder) or a conductive or conductor-filled elastomer. Generally, it is preferable that the second contact pads 2 have a larger surface area than the adjacent end of the receptacle 11 corresponding thereto so that the substrate 12 will still provide adequate peripheral support for each second contact pad 2.

Optionally, as shown in FIG. 1C, a protective layer 80 may be formed or positioned over conductive traces 8 and second contact pads 2, opposite from substrate 12. Protective layer 80 may provide additional physical support for second contact pads 2, as well as for conductive traces 8. In addition, protective layer 80 electrically insulates conductive traces 8 and second contact pads 2. Exemplary materials that may be used to form protective layer 80 include, but are not limited to, dielectric polymers, such as polyimide. By way of example only, a dielectric polymer may be coated over conductive traces 8 and second contact pads 2 by known processes (e.g., spin-on coating, use of a doctor blade, screen printing, sprayed on, etc.) or may comprise a preformed film (e.g., polyimide tape) that is adhered to substrate 12 over conductive traces 8 and second contact pads 2.

The use of receptacles 11 in the interposer 20 of the present invention may shorten the physical lengths of circuits between the first contact pads 4 and their corresponding second contact pads 2, which may reduce electrical inductance relative to that of a more conventional interposer by eliminating the need for conductive vias extending through the thickness of the substrate 12.

Although FIG. 1C depicts a receptacle 11 as exposing a second contact pad 2, the receptacles 11 may alternatively expose a portion of a conductive trace 8, a first contact pad 4, or another feature along a conductive path between a first contact pad 4 and its corresponding second contact pad 2. As such, some receptacles 11 may facilitate testing of particular circuits once conductive structures have been secured to the second contact pads 2 of the interposer 20 and one or more semiconductor devices have been assembled therewith.

The receptacles 11 may be formed with draft angles, countersinks, chamfers, or radii or, alternatively, as recesses with substantially vertical sides. In addition, the cross-sectional shapes of the receptacles 11, taken transverse to the depths thereof, may have circular, rectangular, or other desired shapes. Any process that is suitable for removing material of the type from which the interposer substrate 12 is formed may be used to form the receptacles 11. For example, mask and etch processes may be used to form receptacles 11 in a substrate 12 that is formed from a semiconductor material, glass, or ceramic. Substrates 12 that are formed from resins, or polymers, may have receptacles 11 formed therein by mechanical processes, such as drilling (including laser drilling), punching, milling, or die cutting.

The interposer 20 of the present invention may include a thermally conductive element 6, which may be formed from a thermally conductive material (i.e., a material conducive to heat transfer), such as copper, aluminum, gold, or the like. The thermally conductive element 6 may increase the overall thermal mass of the interposer 20 and, thus, act as a so-called "heat sink" for a semiconductor device positioned in thermal communication therewith. As depicted, the thermally conductive element 6 is located completely within the attach region 7. Alternatively, a thermally conductive element 6 may be located only partially within the attach region 7 or lie completely outside of the attach region 7 and proximate thereto. Preferably, the thermally conductive element 6 is configured to thermally communicate with a semiconductor device disposed upon the interposer 20 so as to convey heat therefrom during operation of the semiconductor device. By way of example only, the thermally conductive element 6 may comprise a part of the at least one layer 52 of conductive structures and may be formed from the same material as one or more of the other conductive structures of that layer 52. Preferably, the thermally conductive element 6 is electrically isolated from other electrically conductive structures of the interposer 20.

The interposer 20 may also include a ground plane 5. The thermally conductive element 6 and the ground plane 5 may comprise the same element or separate elements from one another. Like the thermally conductive element 6, the ground plane 5 may be positioned completely within, partially within, or proximate to an attach region 7 of the interposer substrate 12.

Some of the receptacles 11 that are formed at least partially through the interposer substrate 12 may expose portions of a ground plane 5, a thermally conductive element 6, or a contact pad that communicates with the ground plane 5 and/or thermally conductive element 6. When receptacles 11 are used to facilitate the transfer of heat away from an assembly or package that includes the interposer, the location, volume, and shape of each such receptacle 11 may be tailored to provide particular heat dissipation characteristics. In addition or in the alternative, grooves (not shown) or other structures may be formed partially or completely through the interposer substrate 12 to expose portions of a thermally conductive element 6 and to facilitate the transfer of heat away from an assembly or package including the interposer 20. As an example, and not to limit the scope of the present invention, structures such as receptacles 11 and/or grooves (not shown) that facilitate the transfer of heat away from the thermally conductive element 6 may be distributed across the substrate 12 over roughly the same area as that occupied by thermally conductive element 6.

Figure 2A:
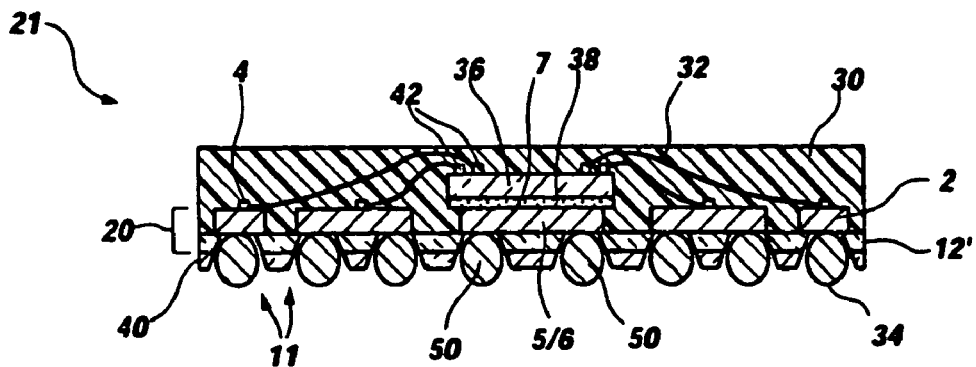
FIG. 2A is a cross-sectional representation of a semiconductor device package incorporating the teachings of the present invention.
Figure 2B:
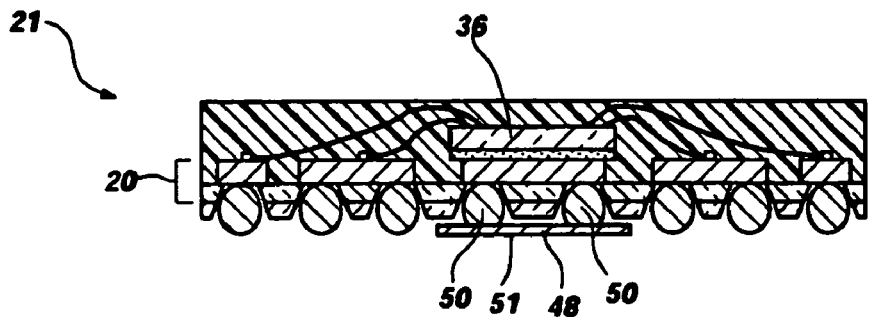
FIG. 2B is a cross-sectional representation of a variation of the semiconductor device package illustrated in FIG. 2A.
Figure 2D:
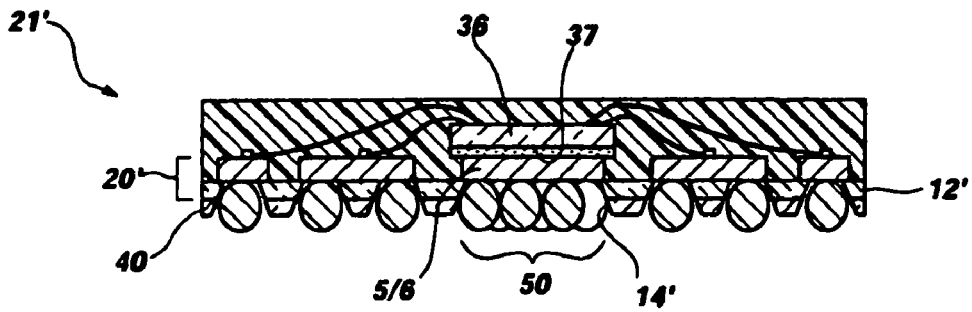
FIG. 2D is a cross section of the semiconductor package illustrated in FIG. 2A with both an increased thermal element area and thermally conductive structures attached thereto.
Figure 2E:
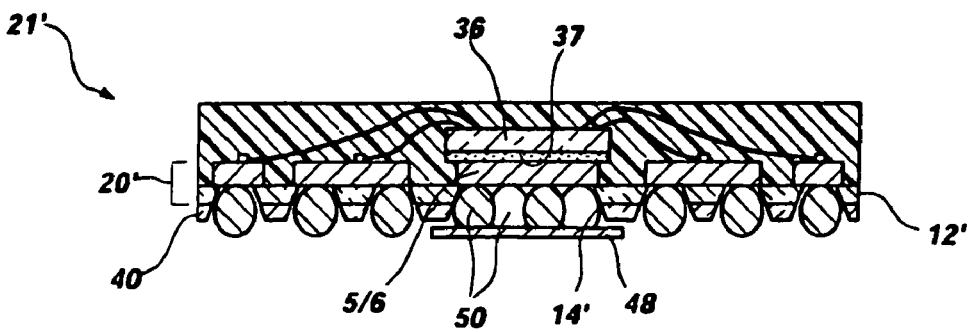
FIG. 2E is a cross-sectional representation of the semiconductor device package illustrated in FIG. 2A with an increased area for thermally conductive structures and at least one heat transfer element attached thereto.
Figure 2C:
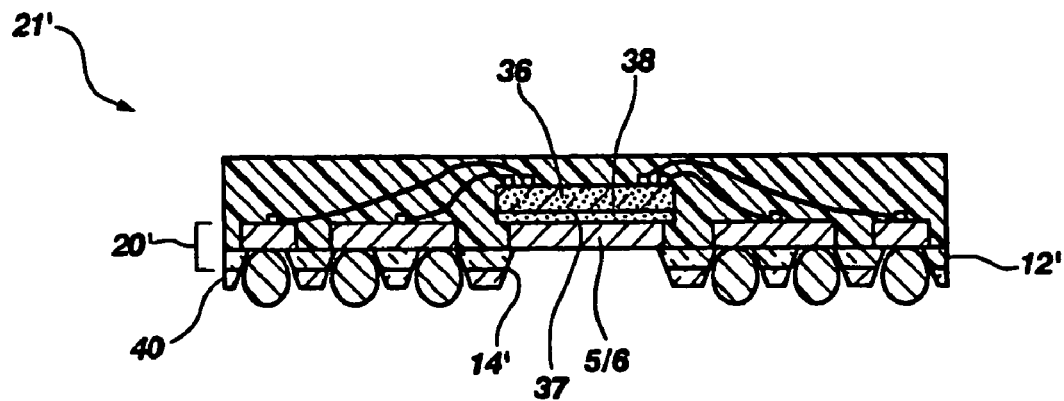
FIG. 2C is a cross-sectional representation of the semiconductor device package illustrated in FIG. 2A with an increased thermal element area for heat dissipation.

As another alternative, shown in FIGS. 2C-2E, an aperture 14' may be formed through the interposer substrate 12' to expose a large, central portion of the thermally conductive element 6 therethrough, with at least some peripheral regions of the thermally conductive element 6 being secured to and supported by the interposer substrate 12'.

Referring now to FIG. 2A, a package 21 including the above-described interposer 20 and a semiconductor device 36 (e.g., the illustrated semiconductor die) affixed thereto is depicted. The semiconductor device 36 may be secured to an attach region 7 of the interposer 20 by way of a die attach material 38, such as a suitable adhesive or adhesive-coated element. Bond pads 42 of the semiconductor device 36 may be electrically connected with corresponding first contact pads 4 of the interposer 20 by way of bond wires 32 or other intermediate conductive elements (e.g., leads, TAB elements carried by a dielectric film, etc.) that are secured to second contact pads 2 formed on the top surface 10 (FIG. 1A) thereof.

In addition, package 21 includes electrically conductive structures 34 secured to at least some of the second contact pads 2 of the substrate 12'. The electrically conductive structures 34 are positioned at least partially within the receptacles 11 formed in the interposer substrate 12' and, thus, are at least partially laterally surrounded by the interposer substrate 12'. Electrically conductive structures 34 may also be secured to a ground plane 5 of the interposer 20 or a contact (not shown in FIG. 2A) that communicates with the ground plane 5.

Thermally conductive structures 50, which resemble and may be formed from the same materials as those from which the electrically conductive structures 34 are formed, may be secured to a thermally conductive element 6 of the interposer 20 or to a contact (not shown in FIG. 2A) that communicates with the thermally conductive element 6. As with the thermally conductive element 6, the thermally conductive structures 50 may increase the overall thermal mass of a package 21 and, thus, act as a heat sink for the adjacent thermally conductive element 6, as well as for a semiconductor device 36 in communication with the thermally conductive element 6. In the event that a single structure forms both a ground plane 5 and a thermally conductive element 6, the conductive structures 34/50 protruding therefrom may be formed from a material that is both electrically and thermally conductive.

The electrically conductive structures 34 may, by way of example only, comprise balls, bumps, columns, pins, or other structures that are formed from an electrically conductive material, such as a metal, a metal alloy (e.g., solder), a conductive elastomer, or a conductor-filled elastomer. Also by way of example, the thermally conductive structures 50 may be formed from a metal, a metal alloy, or another thermally conductive material.

When the electrically conductive structures 34 or thermally conductive structures 50 comprise solder, another metal alloy, or a metal, these structures may be formed, as known in the art, by use of a solder mask 40 that has been secured to (in the case of a preformed film solder mask) or formed on (in the case of an applied solder mask material) the substrate 12' of interposer 20. Once the metal or solder structures have been formed, the solder mask 40 may remain in place adjacent to the interposer 20 or, optionally, be removed from the interposer 20.

When one or more semiconductor devices 36 have been secured and electrically connected to the interposer 20, each semiconductor device 36 may be partially or fully covered with an encapsulant material 30 of a known type, such as a suitable pot mold material, transfer mold material, glob top material, conformal coating material, or the like. Such encapsulant material 30 protects the covered regions of each semiconductor device 36, as well as the bond wires 32 or other intermediate conductive elements that electrically connect the bond pads 42 of the semiconductor device 36 and their corresponding first contact pads 4 on the interposer 20.

A package 21 of the present invention may have a total thickness of less than about 0.8 mm, making it suitable for use in compact electronic devices, such as cellular telephones, handheld computers, and portable computers, where such low-profile packages are required or desired.

FIG. 2B depicts a variation of package 21, in which the ends of the thermally conductive structures 50 that protrude from the interposer 20 are connected to one another by way of a heat transfer element 48. The heat transfer element 48, which further increases the overall thermal mass of the package 21 and, therefore, provides heat sink properties, effectively increases the surface area from which heat may dissipate and may, thereby, increase the rate at which the package 21 is able to dissipate heat by way of convection or radiation. As shown, the heat transfer element 48 is a substantially planar, unitary structure. Alternatively, the heat transfer element 48 may be formed from a number of separate sections. The heat transfer element 48 may optionally include holes, cut-outs, varying cross-sectional properties, or the like, or some combination thereof.

In addition, a surface 51 of the heat transfer element 48 may be mechanically, chemically, or otherwise configured to further enhance the ability of the heat transfer element 48 to dissipate heat from the semiconductor device 36. As examples of chemical treatments of the surface 51 of heat transfer element 48, processes such as coating, greening, or blackening may be employed to increase the emissivity of the heat transfer element 48 for radioactive heat transfer. Examples of mechanical configuration of the surface 51 of the heat transfer element 48 to enhance its heat dissipative properties include geometrical enhancements such as grooves, roughening, or other processes that increase the area of the surface 51. Such surface treatments may be effected before or after the heat transfer element 48 is attached to the thermally conductive structures 50. One or more regions of the surface of the heat transfer element 48 may also be coated with dielectric material to prevent electrical shorting.

FIGS. 2C-2E depict another embodiment of a package 21', which includes an interposer 20' with an interposer substrate 12' that includes an aperture 14' formed therethrough to expose a large portion of the central region of a thermally conductive element 6 that underlies a back side 37 of a semiconductor device 36. At least some of the peripheral edges of the thermally conductive element 6 overlap a surface of the interposer substrate 12' and are physically supported thereby. Also, the solder mask 40 of package 21', if any, does not extend over this portion of the thermally conductive element 6.

The exposed portion of the thermally conductive element 6 may remain exposed through the interposer substrate 12', as depicted in FIG. 2C. Any exposed regions of the surface of the thermally conductive element 6 may be chemically or mechanically treated in such a way as to enhance the thermally dissipative properties thereof, as well as to form an electrically insulative coating thereon. Alternatively, as shown in FIG. 2D, the package 21' may include thermally conductive structures 50 that are positioned within the aperture 14', secured to and protrude from exposed regions of the thermally conductive element 6, and are at least partially laterally surrounded by the interposer substrate 12'. FIG. 2E depicts another alternative, in which the package 21' includes a heat transfer element 48 secured to thermally conductive structures 50 that are secured to and protrude from the thermally conductive element 6.

Figure 5:
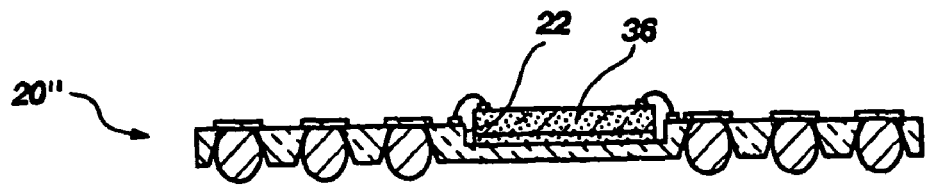
FIG. 5 is a cross-sectional representation of another exemplary embodiment of an interposer of the present invention, which includes a recess for at least partially receiving a semiconductor device, as well as a semiconductor device assembly including the interposer.

Turning now to FIG. 5, another exemplary embodiment of interposer 20'' according to the present invention is depicted. Interposer 20'' includes a receptacle 22 that is configured to at least partially receive a semiconductor device 36 to be electrically connected thereto. The remaining features of interposer 20'' are substantially the same as those of interposer 20 shown in FIGS. 1A-1C.

Figure 6:
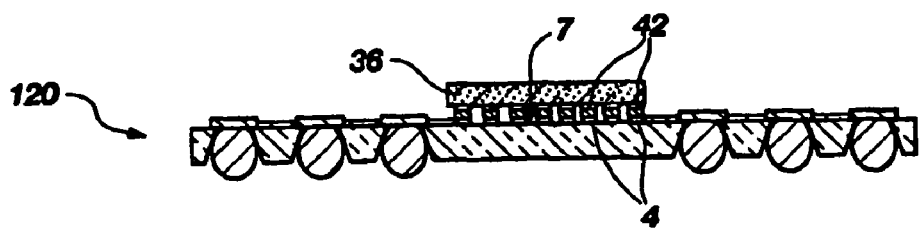
FIG. 6 is a cross-sectional representation of yet another exemplary embodiment of an interposer according to the present invention, which is configured to have at least one semiconductor device flip-chip bonded thereto, as well as an assembly including the interposer and a semiconductor device.

FIG. 6 depicts another embodiment of an interposer 120, of which the first contact pads 4 are positioned in an attach region 7 and positioned to mirror the locations of bond pads 42 so as to facilitate flip-chip attachment of a semiconductor device 36 thereto. The remaining features of interposer 120 are substantially the same as those of interposer 20 shown in FIGS. 1A-1C.

Figure 7:
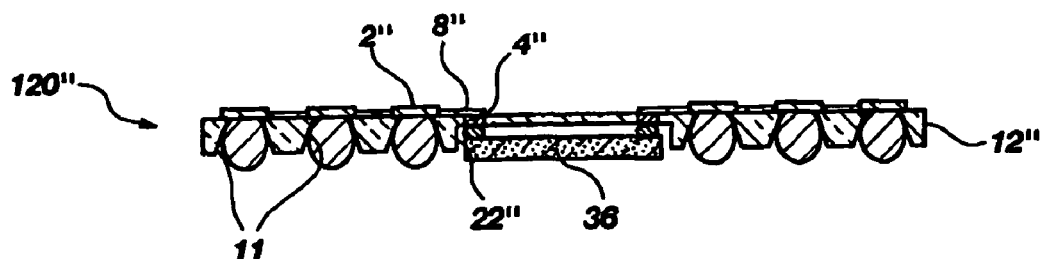
FIG. 7 is a cross-sectional representation of an interposer that incorporates teachings of the present invention and includes a semiconductor device flip-chip bonded to the same side thereof as that from which conductive structures protrude, as well as a semiconductor device assembly including the interposer.

Referring to FIG. 7, another embodiment of interposer 120'' is depicted. Interposer 120'' includes a receptacle 22'' formed in the same surface as that to which receptacles 11 open. Receptacle 22'' is configured to at least partially receive a semiconductor device 36 in a flip-chip orientation. Accordingly, first contact pads 4'' are positioned within the receptacle 22''. Conductive traces 8'' that communicate with the first contact pads 4'' extend across the interposer substrate 12'', either on a surface thereof, as shown, or internally therethrough. The conductive traces 8'' extend laterally to the locations of corresponding second contact pads 2'', which are exposed through the receptacles 11 that are formed through the interposer substrate 12'' so as to at least partially expose corresponding second contact pads 2''.

Figure 3:
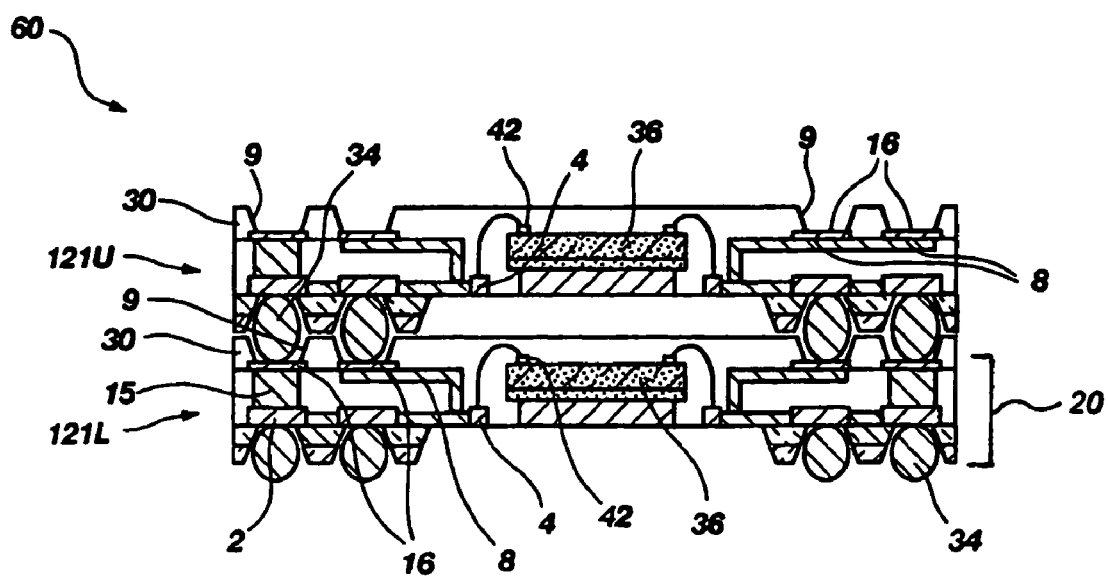
FIG. 3 is a cross-sectional representation of an exemplary embodiment of a multi-chip module incorporating teachings of the present invention, in which a series of separately packaged semiconductor devices are positioned in a stacked arrangement.

Turning now to FIG. 3, an exemplary embodiment of a multi-chip module 60 according to the present invention is depicted. As shown, the multi-chip module 60 includes two packages 121: an upper package 121U and a lower package 121L.

At least the lower package 121L of such a multi-chip module 60 includes an aperture 9 formed through the top of the encapsulant material 30 thereof. Each aperture 9 is configured to at least partially receive a corresponding conductive structure 34 that protrudes from the bottom of an overlying upper package 121U. A contact pad of a third set, which contact pad is referred to herein as a third contact pad 16, is exposed within each aperture 9.

Some third contact pads 16 of the package 121 may communicate with corresponding first contact pads 4 and, thus, ultimately, with the bond pads 42 and corresponding internal circuitry a semiconductor device 36 of the package 121 by way of a conductive trace 8 positioned between the third contact pad 16 and the corresponding first contact pad 4. Some third contact pads 16 of the package 121 may communicate with corresponding second contact pads 2 and, thus, ultimately with one or more electronic components that are external to the package 121 by way of a via 15 or other conductive element positioned between the third contact pad 16 and the corresponding second contact pad 2. Thus, a conductive structure 34 that protrudes from an upper package 121U and its corresponding third contact pad 16 of the next-lower package 121L may facilitate communication between a semiconductor device 36 of the upper package 121U and either a semiconductor device 36 of the next-lower package 121L or an external electronic device.

Based on an overall package height of about 0.8 mm (assuming the height that the encapsulant material 30 protrudes above the interposer 20 is about 0.5 mm, that the receptacles 11 extend completely through the interposer 20, and that the electrically conductive structures 34 therein have heights of about 0.3 mm), the overall thickness of the multi-chip module 60 depicted in FIG. 3 may be about 1.5 mm since the apertures 9 at least partially receive the heights of the electrically conductive structures 34 that protrude from the upper package 121U.

While FIG. 3 depicts a multi-chip module 60 that includes two vertically stacked packages 121U and 121L, it will be understood that a multi-chip module incorporating teachings of the present invention may include more than two packages.

Figure 8:
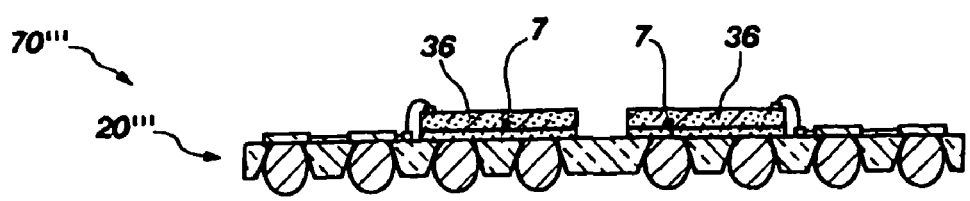
FIG. 8 is a side view of a multi-chip module including a plurality of semiconductor devices positioned at different lateral locations on the same interposer.

Another exemplary embodiment of multi-chip module incorporating teachings of the present invention may be formed by securing multiple semiconductor devices to a single interposer. The semiconductor devices may be positioned at different locations on the interposer, as shown in FIG. 8, or stacked over one or more locations of the interposer, as shown in FIGS. 4A-4D.

Figure 4A:
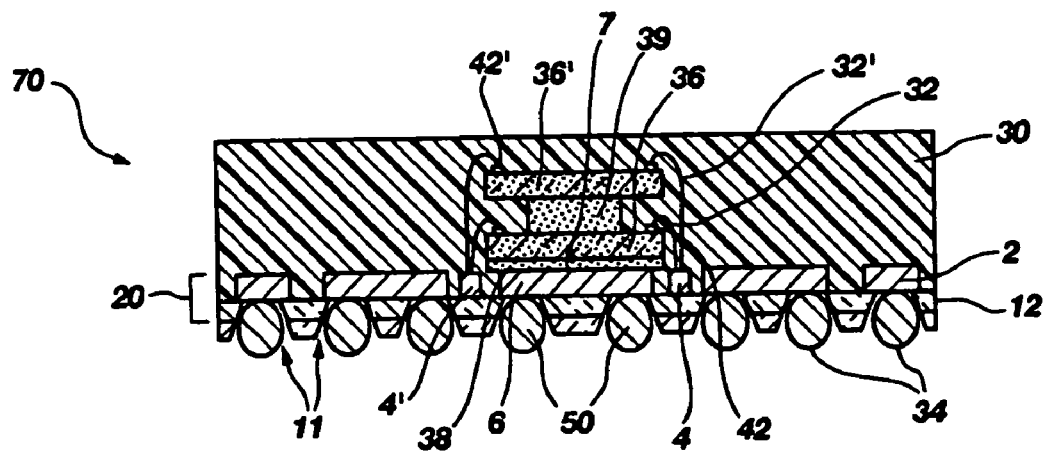
FIG. 4A is a cross-sectional representation of another exemplary embodiment of a multi-chip module incorporating teachings of the present invention, wherein semiconductor devices are stacked over and electrically connected to a single interposer.

With reference to FIG. 4A, a multi-chip module 70 that includes a single interposer 20 with semiconductor devices 36, 36' stacked over the same attach region 7 thereof is depicted. The lower semiconductor device 36 is secured to the interposer 20 by way of a die attach material 38, while another quantity of die attach material 39, such as a suitable adhesive or adhesive-coated element, secures the upper semiconductor device 36' to the lower semiconductor device 36. Intermediate conductive elements, such as the depicted bond wires 32, 32', electrically connect respective bond pads 42, 42' of the semiconductor devices 36, 36' to corresponding first contact pads 4, 4' of the interposer 20.

The multi-chip module 70 may also include electrically conductive structures 34 and/or thermally conductive structures 50 that communicate with second contact pads 2 (FIGS. 1A-1C) and a thermally conductive element 6, respectively.

Such a multi-chip module 70 assembly may be packaged, as known in the art, such as by applying a suitable encapsulant material 30 (e.g., a glob-top type encapsulant, a transfer molded or pot molded type encapsulant, etc.) over at least portions of semiconductor devices 36, 36', the intermediate conductive elements (e.g., bond wires 32, 32'), and at least portions of the interposer 20.

Figure 4B:
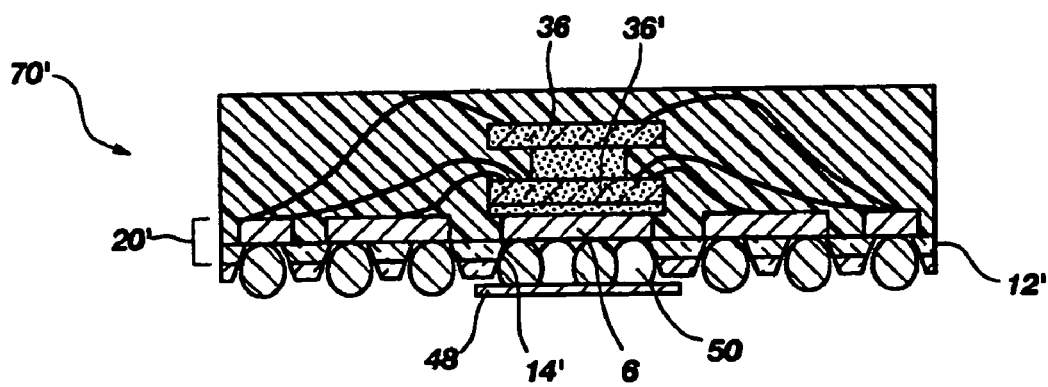
FIGS. 4B, 4C, and 4D are cross-sectional representations of variations of the multi-chip module in FIG. 4A.

In FIG. 4B, a multi-chip module 70' that includes a plurality of semiconductor devices 36, 36' and an interposer 20' of the type depicted in FIGS. 2A-2C is illustrated. In the depicted example, the thermally conductive structures 50 of the multi-chip module 70' are positioned within the aperture 14' formed through the substrate 12' of the interposer 20' and are secured directly to the thermally conductive element 6. In addition, the multi-chip module 70' may include a heat transfer element 48 secured to at least some of the thermally conductive structures 50. FIG. 4C illustrates an embodiment of multi-chip module 70' in which the thermally conductive element 6 is exposed through the aperture 14' formed through the interposer substrate 12'.

Figure 4D:
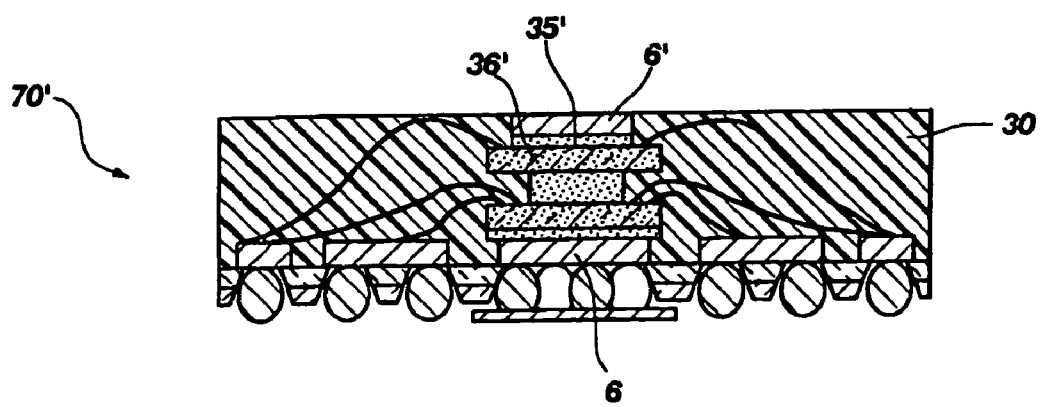
Figure 4C:
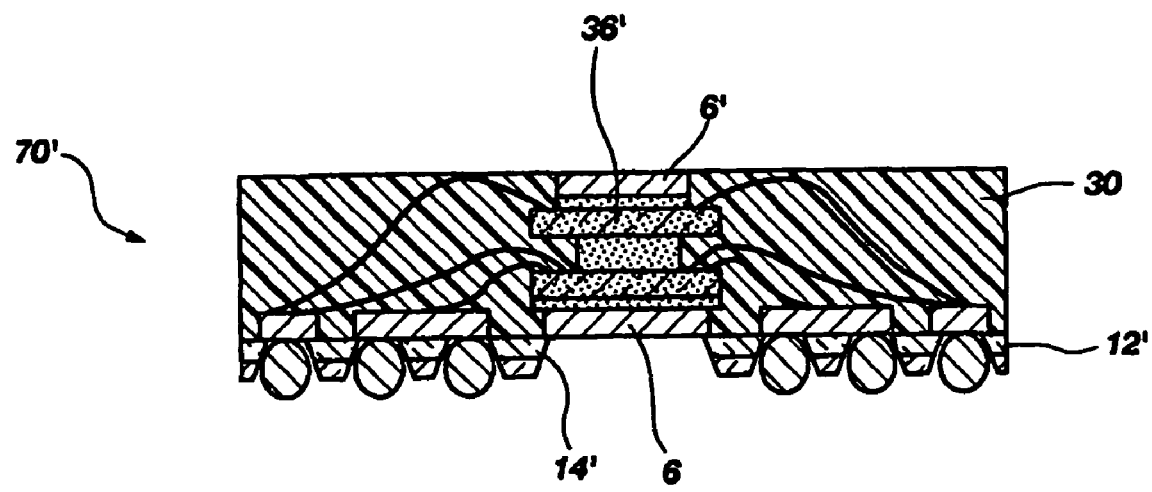

Also, as shown in FIGS. 4C and 4D, a second thermally conductive element 6' may be positioned over an active surface 35' of the upper semiconductor device 36' to facilitate the dissipation of heat therefrom. Of course, in order to provide the desired heat transfer characteristics, at least a portion of the second thermally conductive element 6' may be exposed through an encapsulant material 30 that covers portions of the upper semiconductor device 36'. As with thermally conductive element 6, one or more surfaces of the second thermally conductive element 6' may be chemically or mechanically treated so as to improve the heat dissipation characteristics thereof.

As depicted in FIG. 8, an interposer 20''' with more than one attach region 7 thereon may be used to form a multi-chip module 70''' with semiconductor devices 36 at different lateral positions. Of course, each semiconductor device 36 may be secured and electrically connected to such an interposer 20''' as described above with reference to FIG. 2A.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. An interposer for use in a semiconductor device assembly or package, comprising:
    an interposer substrate;
    at least one conductive structure comprising at least one of a thermally conductive element and a ground plane carried by a surface of the interposer substrate and configured to communicate with a back side of a semiconductor die;
    a plurality of contact pads laterally offset from the at least one conductive structure and electrically isolated therefrom; and
    at least one recess in a surface of the interposer substrate opposite the surface carrying the at least one conductive structure, the at least one recess exposing the at least one conductive structure.

2. The interposer of claim 1, further comprising:
    another plurality of contact pads, each contact pad of the another plurality being laterally offset from a contact pad of the plurality of contact pads.

3. The interposer of claim 2, further comprising:
    a plurality of conductive traces extending between at least some contact pads of the plurality and corresponding contact pads of the another plurality.

4. The interposer of claim 3, wherein at least a portion of at least one of the plurality of conductive traces is carried within the interposer substrate.

5. The interposer of claim 3, wherein each of the plurality of contact pads, the plurality of conductive traces, and the another plurality of contact pads is at least partially carried upon a same, substantially planar surface of the interposer substrate.

6. The interposer of claim 5, wherein at least one attach region is located on the same substantially planar surface of the interposer substrate as the plurality of contact pads, the plurality of conductive traces, and the another plurality of contact pads are carried upon.

7. The interposer of claim 2, further comprising:
    a plurality of recesses formed in a surface of the interposer, at least partially through the interposer substrate and in alignment with at least some contact pads of the plurality of contact pads or the another plurality of contact pads.

8. The interposer of claim 7, wherein at least one attach region is located on a surface of the interposer substrate opposite the surface in which the plurality of recesses is formed.

9. The interposer of claim 7, wherein at least one attach region is located upon the same surface of the interposer substrate as that in which the plurality of recesses is formed.

10. The interposer of claim 2, further comprising:
    at least one upper contact pad accessible from a surface of the substantially planar interposer substrate opposite from that at which the plurality of contact pads or the another plurality of contact pads are accessible.

11. The interposer of claim 1, further comprising:
    a plurality of recesses formed in the opposite surface of the interposer substrate to expose at least portions of the plurality of contact pads.

12. A semiconductor device assembly, comprising:
    an interposer including:
        a substantially planar surface carrying contact pads and at least one conductive structure comprising at least one of a thermally conductive element and a ground plane; and
        a surface opposite the substantially planar surface and including at least one recess therein exposing the at least one conductive structure; and
    at least one semiconductor device including:
        a back side in communication with the at least one conductive structure; and
        bond pads that communicate with corresponding contact pads of the interposer.

13. The semiconductor device assembly of claim 12, further comprising:
    at least one discrete conductive element secured to the at least one conductive structure.

14. The semiconductor device assembly of claim 13, wherein the at least one discrete conductive element is at least partially laterally surrounded by the interposer.

15. The semiconductor device assembly of claim 12, wherein contact surfaces of the contact pads are recessed relative to a surface of the interposer.

16. The semiconductor device assembly of claim 15, wherein the at least one semiconductor device is secured to the same surface as that in which the contact surfaces are recessed.

17. The semiconductor device assembly of claim 16, wherein the at least one semiconductor device is secured and electrically connected to the interposer in a flip-chip orientation.

18. The semiconductor device assembly of claim 15, wherein the at least one semiconductor device is secured to an opposite surface from that in which the contact surfaces are recessed.

19. The semiconductor device assembly of claim 18, wherein the interposer comprises a recess configured to at least partially receive the at least one semiconductor device.

20. The semiconductor device assembly of claim 15, wherein the contact pads are carried upon an opposite surface of the interposer than that in which contact receptacles in which the contact pads are recessed are formed.

21. The semiconductor device assembly of claim 12, wherein the interposer comprises a recess configured to at least partially receive the at least one semiconductor device.

22. The semiconductor device assembly of claim 12, wherein the at least one conductive structure is in contact with at least a portion of the back side of the at least one semiconductor device.

23. The semiconductor device assembly of claim 15, wherein the at least one recess is formed in the same surface of the interposer as that in which the contact pads are recessed.

24. A method for fabricating an interposer, comprising:
   providing a substantially planar interposer substrate with a conductive layer on a surface thereof;
   patterning the conductive layer to form contact pads and at least one conductive structure for communicating with a back side of a semiconductor device; and
   forming at least one recess including tapered side walls in an opposite surface of the substantially planar interposer to expose the at least one conductive structure.

25. The method of claim 24, wherein patterning the conductive layer comprises patterning the conductive layer to form conductive traces extending laterally from the contact pads and outer contact pads at an opposite end of the conductive traces from the contact pads.

26. The method of claim 25, further comprising:
   forming a plurality of recesses in the opposite surface of the substantially planar interposer substrate to expose at least portions of the contact pads.

27. The method of claim 24, further comprising:
   forming a plurality of recesses in the opposite surface of the substantially planar interposer substrate to expose at least portions of the contact pads.

28. The method of claim 24, further comprising:
   forming the conductive layer on the surface of the substantially planar interposer substrate.

29. The method of claim 24, further comprising:
   forming at least one recess for at least partially receiving at least one semiconductor device in a surface of the substantially planar interposer substrate.

30. The method of claim 29, wherein forming the at least one recess is effected in the same surface as that upon which the conductive layer is located.

31. The method of claim 29, wherein forming the at least one recess is effected in a different surface than that upon which the conductive layer is located.

32. A method for designing an interposer, comprising:
   configuring a substantially planar interposer substrate;
   configuring at least one attach location on a surface of the substantially planar interposer substrate;
   configuring contact pads on the surface of the substantially planar interposer substrate;
   configuring at least one conductive structure comprising at least one of a thermally conductive element and a ground plane to be carried at least partially by the at least one attach location for communicating with a back side of a semiconductor die secured to the at least one die attach location; and
   configuring at least one recess in an opposite surface of the substantially planar interposer substrate to expose the at least one conductive structure at the opposite surface.

33. The method of claim 32, further comprising:
   configuring conductive trace locations to be carried by the substantially planar interposer substrate; and
   configuring outer contact pad locations to be carried by the substantially planar interposer substrate, each outer contact pad location being configured to be offset from a corresponding contact pad location, each conductive trace location being configured to extend between a contact pad location and a corresponding outer contact pad location.

34. The method of claim 32, further comprising:
   configuring a plurality of recesses to be formed in the opposite surface of the substantially planar interposer substrate to at least partially expose corresponding contact pads.

35. The method of claim 34, wherein configuring the at least one attach location comprises configuring the at least one attach location on the same surface of the substantially planar substrate as that in which the plurality of recesses is configured.

36. The method of claim 34, wherein configuring the at least one attach location comprises configuring the at least one attach location in an opposite surface of the substantially planar substrate from that in which the plurality of recesses is configured.

37. The method of claim 32, further comprising:
   configuring a plurality of recesses to be formed in the substantially planar interposer substrate to expose the contact pads.

38. The method of claim 32, wherein configuring the at least one conductive structure comprises configuring at least one thermally conductive element location at least partially within the at least one attach location.

39. The method of claim 38, further comprising:
   configuring a plurality of recesses in the opposite surface to expose the contact pads.

40. The method of claim 32, wherein configuring the at least one conductive structure comprises configuring at least one ground plane at least partially within the at least one attach location.

41. A method for forming a semiconductor device assembly, comprising:
   securing at least one semiconductor device to a conductive structure comprising at least one of a thermally conductive element and a ground plane at an attach location of a substantially planar interposer with a back side of the at least one semiconductor device communicating with the conductive structure, the conductive structure exposed through at least one recess in a surface of the substantially planar interposer opposite a side of the conductive structure to which the at least one semiconductor device is secured; and
   electrically connecting the at least one semiconductor device with the interposer.

42. The method of claim 41, wherein providing the interposer comprises providing an interposer with recessed contact pads.

43. The method of claim 42, further comprising:

securing at least one discrete conductive element to the conductive structure, the at least one discrete conductive element being at least partially laterally surrounded by the interposer.

44. The method of claim 42, wherein electrically connecting the at least one semiconductor device comprises securing the at least one semiconductor device to the same surface of the interposer as that in which the contact pads are recessed.

45. The method of claim 42, wherein electrically connecting the at least one semiconductor device comprises securing the at least one semiconductor device to an opposite surface of the interposer as that in which the contact pads are recessed.

46. The method of claim 41, further comprising:

at least partially encapsulating at least the at least one semiconductor device.

* * * * *